United States Patent [19]

Shigeki

[11] Patent Number: 4,946,714
[45] Date of Patent: Aug. 7, 1990

[54] METHOD FOR PRODUCING SEMICONDUCTOR DEVICES

[75] Inventor: Susumi Shigeki, Fukuoka, Japan

[73] Assignee: Mitsubishi Denki Kabushiki Kaisha, Japan

[21] Appl. No.: 465,503

[22] Filed: Jan. 16, 1990

Related U.S. Application Data

[62] Division of Ser. No. 235,164, Aug. 23, 1988, Pat. No. 4,920,920.

[30] Foreign Application Priority Data

Aug. 25, 1987 [JP] Japan ................................ 62-210584

[51] Int. Cl.$^5$ .............................................. C23C 16/00
[52] U.S. Cl. .................................................. 427/248.1
[58] Field of Search ...................... 427/248.1; 118/715, 118/725

[56] References Cited

U.S. PATENT DOCUMENTS

| | | | |
|---|---|---|---|
| 4,154,192 | 5/1979 | Tsubouchi | 118/715 |
| 4,487,161 | 12/1984 | Hirata | 118/725 |
| 4,867,859 | 9/1989 | Harada et al. | 204/298 |

FOREIGN PATENT DOCUMENTS 62-158332  7/1987  Japan .

*Primary Examiner*—Richard Bueker
*Attorney, Agent, or Firm*—Leydig, Voit & Mayer

[57] ABSTRACT

An apparatus for producing semiconductor devices has a hollow reaction tube which receives a boat carrying a row of a multiplicity of semiconductor wafers held in vertical posture. A flow stabilizing member is disposed in the vicinity of the wafer which is on the downstream end of the wafer row as viewed in the direction of flow of a treating gas introduced into the reaction tube. The flow stabilizing member has such configuration as to progressively converge towards the downstream end of the reaction tube and the maximum-diameter of the flow stabilizing member is substantially the same as that of the wafer. The flow stabilizing member effectively prevents generation of any turbulency of the reaction gas in the region near the downstream end of the reaction tube so that induction of air into the reaction tube which may otherwise be caused by the turbulency is avoided. In consequence, degradation of the quality of product semiconductor devices is avoided and yield is improved.

1 Claim, 2 Drawing Sheets

METHOD FOR PRODUCING SEMICONDUCTOR DEVICES

This application is a division of application Ser. No. 07/235,164, filed Aug. 23, 1988, now U.S. Pat. No. 4,920,920.

BACKGROUND OF THE INVENTION

1. Field of the Invention

The present invention relates to an apparatus for and method of producing semiconductor devices. More particularly, the invention is concerned with method and apparatus for producing semiconductor devices, wherein a multiplicity of semiconductor wafers held in a vertical posture are mounted on a boat and are placed in a reaction tube which is supplied from its front end with reaction gas so that the semiconductor wafers are processed with the reaction gas.

2. Description of the Related Art

FIG. 1 schematically illustrates a conventional apparatus for producing semiconductor devices. This apparatus, generally designated at a numeral 100, has a reaction tube 2 made of quartz and designed to receive a quartz boat 1. The boat 1 carries a multiplicity of semiconductor wafers W, $W_0$ to be processed. These semiconductor wafers are held in vertical posture and arranged in parallel with their surfaces directed forward or backward. The reaction tube 2 is surrounded by a heater 3 which is capable of heating the semiconductor wafer W and $W_0$ to a predetermined temperature. At the same time, a reaction gas supply control device 4 is provided on the front end of the reaction tube 2 so as to supply a reaction gas G into the reaction tube 2 at a controlled flow rate. The reaction gas G flows through the row of the semiconductor wafers in the reaction tube 2 so as to effect predetermined processing on the wafers W and is then discharged to the outside through a duct 5 provided on the rear end of the reaction tube 2.

A power supply controller 6 connected to the heater 3 is capable of controlling the electric current in the heater 3. A closure or lid provided on the rear end of the reaction tube closes the rear end opening of the reaction tube 2 through which the boat 1 is loaded into and removed from the reaction tube 2.

This apparatus 100 for producing semiconductor devices has an advantage that a multiplicity of semiconductor wafers W are processed at once. This apparatus, however, suffers from the following disadvantage. Namely, the reaction gas G, when it enters into the space indicated at A between the final wafer $W_0$ of the wafer row and the lid 7 on the rear end of the reaction tube 2, a turbulency of flow of the reaction gas is generated as indicated at V because the volume or the cross-sectional area of the flow passage drastically increases. Such a turbulency of reaction gas may cause the ambient air to be induced into the reaction tube 2 through the gas outlet port (not shown) provided in the lid 7. The air may reach the rear end of the row of the wafers across the above-mentioned space A. In consequence, the ambient air, particularly oxygen contained in the air, is undesirably trapped in the semiconductor wafer or wafers, with the result that characteristic of the product semiconductor device are seriously impaired and reduce the yield.

For the purpose of eliminating such a problem, it would be an effective measure to increase the length of the space A, i.e., to increase the distance between the final wafer $W_0$ and the lid 7 so as to keep the final wafer $W_0$ from any unfavorable effect which may be caused by air induced as a result of turbulency of flow of the reaction gas. Such a measure, however, is disadvantageous in that the number of the semiconductor wafers W which can be processed in a reaction tube of a given length is decreased so that the production efficiency is lowered undesirably. In order to achieve a high production efficiency while avoiding the above-described problems of the prior art, it is necessary to employ a reaction tube 2 having a large length, with the result that the overall length of the apparatus is undesirably increased.

SUMMARY OF THE INVENTION

Accordingly, an object of the present invention is to provide an apparatus for and a method of producing semiconductor devices, wherein generation of turbulency of flow of the reaction gas in the downstream end portion of the reaction tube is suppressed so as to prevent induction of ambient air into the reaction tube, thereby effectively preventing degradation of quality of the product semiconductor wafers and remarkably improving the yield, without causing reduction in the production efficiency and without requiring the apparatus size to be increased, thus overcoming the above-described problems of the prior art.

To this end, according to one aspect of the present invention, there is provided an apparatus for producing semiconductor devices comprising: a hollow reaction tube; reaction gas supplying means provided on an end of the reaction tube and designed to introduced a reaction gas into the reaction tube; a boat received in the reaction tube and carrying a multiplicity of semiconductor wafers arranged in a row and held in vertical posture; a flow stabilizing member disposed in the reaction tube near the other end of the reaction tube and on the downstream side of the row of wafers as viewed in the direction of flow of the reaction gas, the flow stabilizing member having the maximum diameter substantially the same as that of the wafer and the cross-sectional area of the flow stabilizing member progressively decreasing toward the other end of the reaction tube; a lid provided on the other end of the reaction tube; and a duct provided on the the other end of the reaction tube and capable of allowing the reaction gas to be discharged to the exterior of the apparatus.

According to another aspect of the present invention, there is provided a method of producing semiconductor devices by using a reaction tube in which a boat carrying a row of a multiplicity of semiconductor wafers held in vertical posture is placed so that the semiconductor wafers are processed by a reaction gas introduced into the reaction tube, the method comprising: introducing the reaction gas into the reaction tube from one end of the reaction tube while placing, at least one the downstream side of the row of wafers, a flow stabilizing member the cross-sectional area of which progressively decreases towards the other end of the reaction tube.

In operation, the reaction gas supplied from the one end of the reaction tube flows along the row of the semiconductor wafers and reaches the flow stabilizer member disposed(in the space downstream of the row of wafers. Since the flow stabilizer is so shaped as to converge towards the downstream end, the cross-sectional area of the flow passage for the reaction gas increases progressively rather than being changed drastically, so that the reaction gas can flow towards the outlet end of the reaction tube in the form of a laminar flow without any turbulency.

The above and other objects, features and advantages of the present invention will become clear from the following description of the peferred embodiments when the same is read in conjunction with the accompanying drawings.

DESCRIPTION OF THE PREERRED EMBODIMENTS

Figure 1:
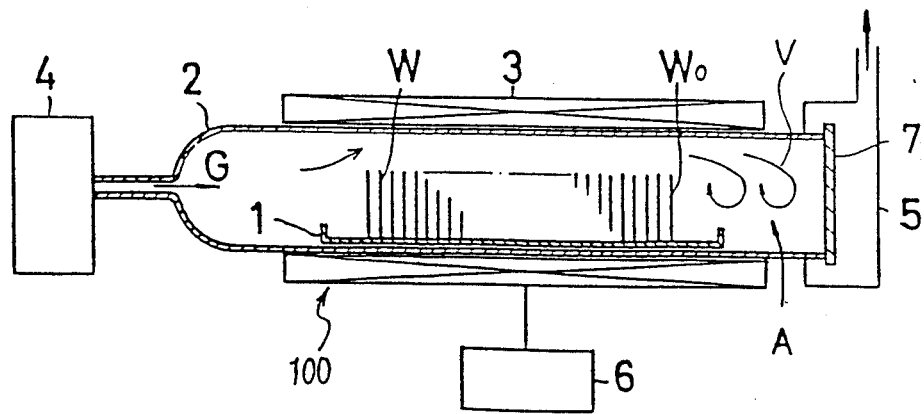
FIG. 1 is a schematic longitudinal sectional view of a conventional apparatus for producing semiconductor devices.
Figure 2:
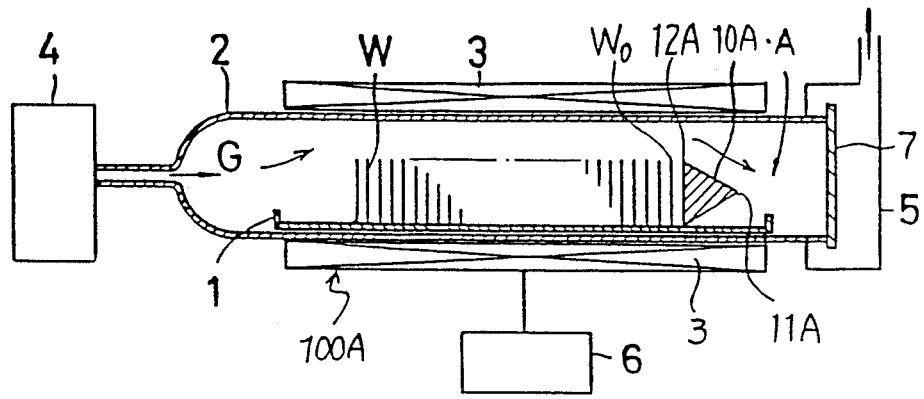
FIGS. 2 and 3 are schematic longitudinal sectional views of different embodiments of the apparatus for producing semiconductor devices according to the present invention.

FIG. 2 is a schematic longitudinal sectional view of an embodiment of an apparatus of the invention for producing semiconductor devices. The production apparatus, generally denoted by a numeral 100A, includes a hollow reaction tube 2 made of, for example, quartz and a reaction gas supply means 4 for supplying a reaction gas G into the reaction tube 2. A boat 1 carrying a multiplicity of semiconductor wafers W is received in the reaction tube 2. The semiconductor wafers are held in vertical posture and are arranged in parallel so as to form a row along the flow of the reaction gas G, such that their major surfaces face the upstream or downstream end of the reaction tube 2. A flow stabilizing member 10A is disposed in the reaction tube 2 at a position near and downstream of the wafer $W_0$ which is on the downstream end of the wafer row as viewed in the direction of flow of the gas. Heating means such as a heater 3 for maintaining the temperature of the semiconductor wafer W at a suitable level is disposed so as to surround the reaction tube 2. A boat entrance opening (not shown) for allowing the boat 1 to be brought into and out of the reaction tube 2 is formed on the rear end of the reaction tube 2. The opening is normally closed by a lid 7. A discharge duct 5 surrounds the lid 7 so as to allow waste gas, i.e., reaction gas which has not reacted yet, to be discharged to the exterior of the apparatus.

The flow stabilizing member 10A incorporated in the embodiment of FIG. 2 is a conical member made of a suitable heat-resistant material such as quartz and having a diameter substantially the same as that of the wafers W. The flow stabilizing member 10A is disposed such that its pointing end 11A is directed towards the downstream end with its maximum-diameter end 12A spaced slightly from the wafer $W_0$ which is on the downstream end of the row of wafers W.

Figure 3:
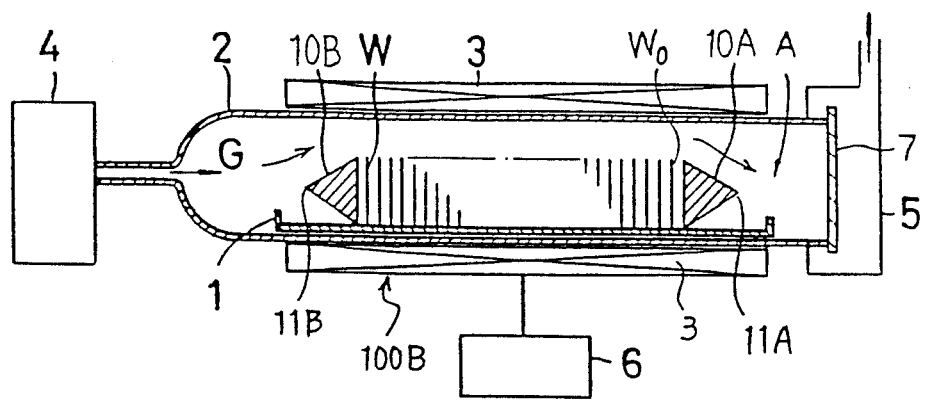

FIG. 3 shows another embodiment. The apparatus of this embodiment, generally denoted by 100B, has a construction substantially the same as that of the embodiment shown in FIG. 2, except that an additional flow stabilizing member 10B is disposed on the upstream side of the row of wafers such that its pointing end is directed towards the upstream end of the reaction tube 2. Other portions of the apparatus shown in FIG. 3 are materially the same as those in the apparatus of FIG. 2 and are denoted by the same reference numerals as those in the apparatus of FIG. 2.

Although the flow stabilizing members 10A, 10B incorporated in the described embodiments have conical forms, this is not exclusive and various other forms which progressively decrease in cross-sectional area thereof can be used suitably. For instance, the flow stabilizing member can have a stream-lined configuration with a rounded end.

Figure 4:
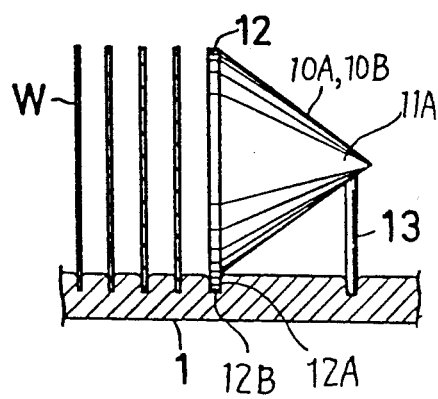
FIGS. 4 and 5 are enlarged sectional views of a flow stabilizer incorporated in the embodiments shown in Figs. 2 and 3.
Figure 5:
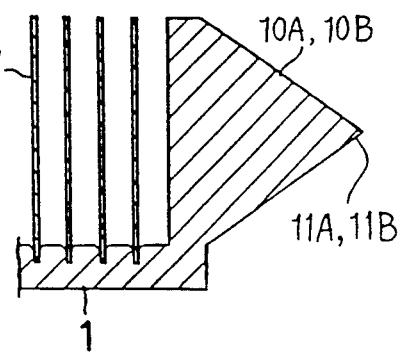

Referring to FIG. 4, the flow stabilizing member 10A or 10B may be detachably fixed to the boat 1 with its flange 12A formed on the largest diameter end thereof received in a groove 12B which is formed in the bottom surface of the boat 1, while the pointing end 11A or 11B is supported on the boar 1 through a post 13. However, the flow stabilizing member need not always be detachable. Namely, the flow stabilizing member 10A or 10B may be formed integrally with the boat 1 as shown in FIG. 5. Although not shown, the arrangement may be such that the flow stabilizing members 10A and 10B are formed separately from the boat 1 so as to be set in the reaction tube 2 together with the boat. The embodiment shown in FIG. 3, which incorporates an additional flow stabilizing member 10B on the upstream end of the row of wafers, offers an advantage that the flow of the reaction gas G is further stabilized over the arrangement shown in FIG. 2. The provision of the flow stabilizing member 10B on the upstream side of the wafer row, however, is not essential. Namely, the invention requires that a flow stabilizing member is provided on at least the downstream side of the wafer row.

In operation, the reaction gas G supplied from the upstream end of the reaction tube 2 flows through and along the row of wafers W and reaches the flow stabilizing member 10A disposed in the space A which is on the downstream side of the wafer row. Since the flow stabilizing member 10A is formed such as to progressively decrease its cross-sectional area towards the lid 7, the cross-sectional area of the gas passage increases progressively rather than being changed drastically, so that the reaction gas G is introduced through the space A towards the downstream end of the reaction tube in the form of a laminar flow without substantial turbulency.

The elimination of turbulency of the reaction gas in the space A effectively prevents ambient air from being induced into the reaction tube. It is therefore possible to effectively avoid any degradation of quality of the product semiconductor device, without incurring any reduction in the production efficiency or enlargement of the size of the apparatus, while achieving an appreciable improvement in the yield.

What is claimed is:

1. A method of producing semiconductor devices by using a reaction tube in which a boat carrying a multiplicity of semiconductor wafers held generally parallel to each other and transverse to the flow of a reaction gas introduced into said reaction tube, said method comprising introducing said reaction gas into said reaction tube from one end of said reaction tube while placing, at least on the downstream side of said row of wafers, a flow stabilizing member, the cross-section area of which progressively decreases toward the other end of said reaction tube.

* * * * *